(12) United States Patent
Campbell

(10) Patent No.: US 11,342,956 B2
(45) Date of Patent: May 24, 2022

(54) WIRELESS TWO-WAY COMMUNICATION IN COMPLEX MEDIA

(71) Applicant: GroGuru, Inc., San Diego, CA (US)

(72) Inventor: Jeffrey E. Campbell, Boise, ID (US)

(73) Assignee: GroGuru, Inc., San Diego, CA (US)

( * ) Notice: Subject to any disclaimer, the term of this patent is extended or adjusted under 35 U.S.C. 154(b) by 0 days.

(21) Appl. No.: 17/118,454

(22) Filed: Dec. 10, 2020

(65) Prior Publication Data

US 2021/0184718 A1 Jun. 17, 2021

Related U.S. Application Data

(60) Provisional application No. 62/947,340, filed on Dec. 12, 2019.

(51) Int. Cl.
*H04B 1/40* (2015.01)
*G01V 11/00* (2006.01)
*H03F 3/19* (2006.01)

(52) U.S. Cl.
CPC ............. *H04B 1/40* (2013.01); *G01V 11/002* (2013.01); *H03F 3/19* (2013.01); *H03F 2200/451* (2013.01)

(58) Field of Classification Search
CPC ........... H04B 1/40; G01V 11/002; H03F 3/19; H03F 2200/451
See application file for complete search history.

(56) References Cited

U.S. PATENT DOCUMENTS 6,971,391 B1 * 12/2005 Wang ..................... H01B 11/10
128/846
7,127,294 B1 * 10/2006 Wang ................... A61N 1/3718
607/36
(Continued)

FOREIGN PATENT DOCUMENTS

CA 2983230 A1 * 10/2016 ............... G01K 3/04
CN 104991049 A 10/2015
(Continued)

OTHER PUBLICATIONS

Coil and device for wireless signal transmission, and method for producing such a coil, TUGZ—Transfer and Entrepreneur Centre, Last Modification: May 12, 2019 (Year: 2019).*
(Continued)

*Primary Examiner* — Berhanu Tadese
(74) *Attorney, Agent, or Firm* — Mintz Levin Cohn Ferris Glovsky and Popeo, P.C.

(57) ABSTRACT

In an embodiment, a circuit includes a resonant portion, a plurality of switches, a first impedance, an amplifier, and a demodulator. The resonant portion includes a single RF coil and is configured for transmission/reception at about the same frequency. The switches include first, second, and third switches. The first switch includes an input in communication with a power source and an output in communication with ground. The second switch includes an input between the power source and the first switch and an output in communication with a resonant portion input. The third switch includes an input in communication with a resonant portion output and an output in communication with ground. The first impedance is between the resonant portion output and the third switch input. The amplifier includes an input between the first impedance and the third switch input. The (Continued)

demodulator includes an input in communication with the amplifier output.

14 Claims, 8 Drawing Sheets

(56) References Cited

U.S. PATENT DOCUMENTS

| | | | | |
|---|---|---|---|---|
| 7,408,364 B1* | 8/2008 | Campbell | ............ | G01N 33/246 324/644 |
| 7,535,237 B1* | 5/2009 | Campbell | ............ | G01N 27/223 324/644 |
| 8,035,403 B1* | 10/2011 | Campbell | ............ | G01N 33/24 324/694 |
| 8,302,881 B1* | 11/2012 | Campbell | ............ | A01G 25/167 239/11 |
| 8,340,910 B1* | 12/2012 | Magro | ............ | G01N 33/24 702/2 |
| 8,682,494 B1* | 3/2014 | Magro | ............ | A01G 25/167 700/284 |
| 8,744,772 B1* | 6/2014 | Magro | ............ | G01N 33/24 702/2 |
| 8,751,052 B1* | 6/2014 | Campbell | ............ | A01G 25/167 700/284 |
| 8,862,277 B1* | 10/2014 | Campbell | ............ | A01G 25/167 700/284 |
| 9,046,461 B1* | 6/2015 | Sohrabi | ............ | G01N 27/04 |
| 10,073,074 B1* | 9/2018 | Kumar | ............ | G01N 27/026 |
| 2004/0100394 A1* | 5/2004 | Hitt | ............ | A01G 25/167 340/870.11 |
| 2004/0210289 A1* | 10/2004 | Wang | ............ | B82Y 25/00 607/116 |
| 2004/0230271 A1* | 11/2004 | Wang | ............ | A61N 1/3718 607/116 |
| 2004/0249428 A1* | 12/2004 | Wang | ............ | A61L 29/10 607/116 |
| 2005/0137752 A1* | 6/2005 | Alvarez | ............ | G01F 15/063 700/282 |
| 2009/0310709 A1* | 12/2009 | Bare | ............ | H04L 27/04 375/300 |
| 2010/0015918 A1* | 1/2010 | Liu | ............ | H04B 5/00 455/41.1 |
| 2011/0035059 A1* | 2/2011 | Ersavas | ............ | G05D 7/0617 700/276 |
| 2013/0285659 A1* | 10/2013 | Sohn | ............ | G01R 33/3456 324/314 |
| 2014/0015679 A1* | 1/2014 | Campbell | ............ | G08B 21/20 340/604 |
| 2014/0024313 A1* | 1/2014 | Campbell | ............ | G06Q 50/02 455/41.2 |
| 2014/0077969 A1* | 3/2014 | Vian | ............ | G08C 17/02 340/870.02 |
| 2014/0206986 A1* | 7/2014 | Imran | ............ | A61B 5/065 600/424 |
| 2014/0277675 A1* | 9/2014 | Anderson | ............ | G05D 1/0212 700/114 |
| 2014/0338447 A1* | 11/2014 | Sharpe | ............ | A01K 29/005 73/431 |
| 2016/0006475 A1* | 1/2016 | Chen | ............ | H04B 1/48 455/83 |
| 2016/0030755 A1* | 2/2016 | Parramon | ............ | A61N 1/37223 607/60 |
| 2017/0040960 A1* | 2/2017 | Watkins | ............ | H03F 3/2178 |
| 2017/0077996 A1* | 3/2017 | Kim | ............ | H02J 7/025 |
| 2017/0180013 A1* | 6/2017 | Kuttan | ............ | H04B 5/0031 |
| 2017/0251589 A1* | 9/2017 | Tippery | ............ | A01B 69/008 |
| 2017/0269016 A1* | 9/2017 | Anjum | ............ | A01G 25/167 |
| 2017/0303466 A1* | 10/2017 | Grufman | ............ | H04N 7/185 |
| 2017/0344020 A1* | 11/2017 | Mannefred | ............ | G06K 9/00791 |
| 2017/0364088 A1* | 12/2017 | Grufman | ............ | A01D 34/008 |
| 2017/0364090 A1* | 12/2017 | Grufman | ............ | G01S 19/13 |
| 2018/0103579 A1* | 4/2018 | Grufman | ............ | G05D 1/0088 |
| 2019/0186287 A1* | 6/2019 | Lowery | ............ | F01D 21/003 |
| 2019/0278001 A1* | 9/2019 | Campbell | ............ | G01W 1/02 |
| 2019/0285422 A1* | 9/2019 | Opitsch | ............ | G01C 21/3826 |
| 2020/0007960 A1* | 1/2020 | Campbell | ............ | G01W 1/02 |
| 2020/0395127 A1* | 12/2020 | Lutz | ............ | G16H 10/40 |
| 2021/0184718 A1* | 6/2021 | Campbell | ............ | H03F 3/19 |

FOREIGN PATENT DOCUMENTS

| | | | | |
|---|---|---|---|---|
| CN | 107094031 A | | 8/2017 | |
| WO | WO-2006053059 A2 * | | 5/2006 | ............ G01D 21/00 |
| WO | WO-2019201938 A1 * | | 10/2019 | ............ H01Q 7/00 |

OTHER PUBLICATIONS

International Search Report and Written Opinion issued in corresponding International Application No. PCT/US20/64292, dated Mar. 23, 2021, 10 pages.

A. Markham and N. Trigoni, "Magneto-Inductive NEtworked Rescue System (MINERS): Taking Sensor Networks Underground," IPSN '12: Proceedings of the 11th international conference on Information Processing in Sensor Networks, pp. 317-328, Apr. 2012.

* cited by examiner

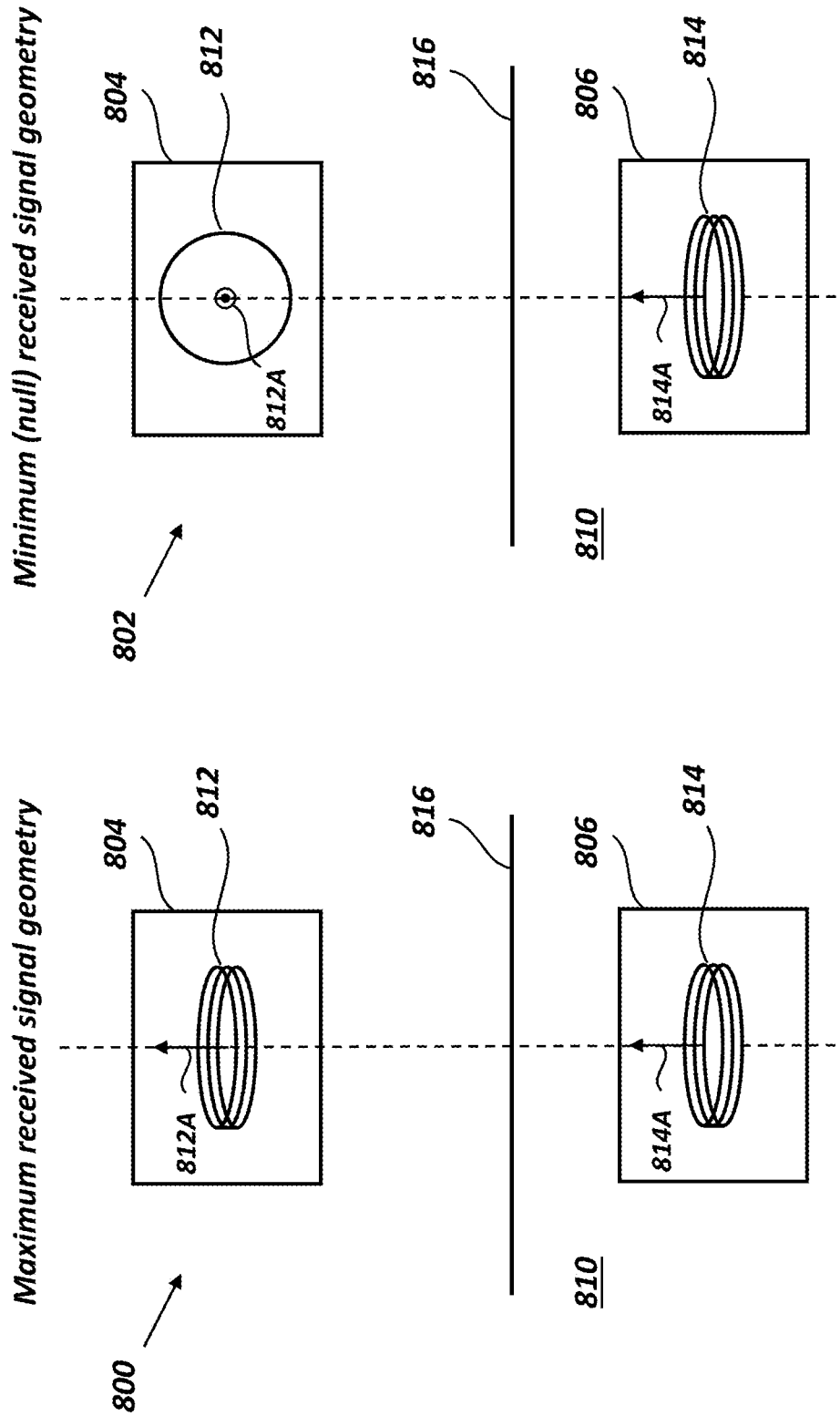

WIRELESS TWO-WAY COMMUNICATION IN COMPLEX MEDIA

CROSS-REFERENCE TO RELATED APPLICATIONS

This application claims the benefit of U.S. Provisional Patent Application No. 62/947,340, filed on Dec. 12, 2019, entitled "Wireless Two-Way Communication In Complex Media," the entirety of which is incorporated by reference herein.

BACKGROUND

Sensing environmental conditions within an electromagnetic-absorbing material (e.g., soil, concrete, water, etc.) can be desirable in a variety of applications. As an example, in agricultural applications, soil conditions such as moisture, salinity, and temperature can have a significant impact on crops grown in the soil. Ongoing measurement of these soil conditions can allow growers to monitor soil conditions and, as necessary, treat the soil to maintain soil conditions within desired ranges.

SUMMARY

While various types of sensors have been developed for measuring environmental conditions within a material, communicating data from the sensors to outside the material can be challenging. In one example, a wired connection can be established between a subsurface sensor and an above-ground receiver. However, wired communication can be undesirable or impractical in many applications. In agriculture applications, wires can be easily broken or damaged by rodent activity or tilling/harvesting operations. In other applications, use of wired connections can be undesirable due to the potential for vandalism, appearance, or other reasons.

The use of electromagnetic (wireless) communication has been proposed to alleviate some of these problems. However, numerous challenges have prevented practical commercial application. These challenges can include: inadequate communications range due to the attenuation of propagating electromagnetic waves (particularly in electromagnetic-absorbing materials), unreliable operation due to changes in electromagnetic characteristics of the material, large equipment/antenna sizes that are incompatible with easy installation/removal of buried sensors, and excessive power consumption incompatible with long-term or battery-powered operation.

In general, improved systems and methods are provided for two way communication by sub-surface sensors.

In an embodiment, a transceiver circuit is provided and includes a resonant portion, a plurality of switches, a first complex impedance, an amplifier, and a demodulator. The resonant portion can include a single radiofrequency (RF) coil and the resonant portion can be configured for transmission and reception at about the same frequency. The plurality of switches can include a first switch, a second switch, and a third switch. The first switch can include an input in electrical communication a power source and an output in electrical communication with ground. The second switch can include an input interposed between the power source and the first switch and an output in electrical communication with an input of the resonant portion. The third switch can include an input in electrical communication with an output of the resonant portion and an output in electrical communication with ground. The first complex impedance can be interposed between the output of the resonant portion and the input of the third switch. The amplifier can include an amplifier input interposed between the first impedance and the input the third switch. The demodulator can include an input in electrical communication with the amplifier output.

In an embodiment, the circuit can also include a processor and a sensor in electrical communication with the processor. The processor can be configured to receive one or more sensor measurement signals output by the sensor. The one or more measurement signals can include data characterizing at least one parameter of a subsurface material measured by the sensor.

In another embodiment, the processor is configured to command the second and third switches to close and command the first switch to open and close at a closure frequency that provides current from the power source to the radiofrequency coil in the form of a carrier signal. The carrier signal can be transmitted by the radiofrequency coil at a transmission frequency. The amplifier and the demodulator can be electrically isolated from the resonant portion when the second and third switches are closed.

In another embodiment, the carrier signal can be a square wave representing at least a portion of the sensor measurement signal.

In another embodiment, a capacitance of the resonant portion, an inductance of the resonant portion, and the closure frequency can be selected such that the carrier frequency is a sinusoid.

In another embodiment, the first impedance can be a variable impedance configured to shift a resonant frequency of an oscillator formed by resonant portion and the first impedance to be approximately equal to the transmission frequency.

In another embodiment, the processor can be configured to command the second and third switches to open such that an oscillating signal received by the radiofrequency coil is received at the input of the amplifier. The amplifier can also be configured to amplify the received oscillating signal. The demodulator can be configured to receive the amplified oscillating signal, demodulate the amplified oscillating signal; and output a data signal generated from the demodulated amplified oscillating signal to the processor. The resonant portion can also be isolated from the power source when the second and third switches are open.

In another embodiment, at least one of the second and third switches is a diode.

In another embodiment, the resonant portion can also include a first capacitor and a second capacitor.

In another embodiment, an input of the first capacitor can be in electrical communication with the output of the second switch and an output of the first capacitor is in electrical communication with ground. An input of the second capacitor can also be in electrical communication with the output of the second switch and an output of the second capacitor is in electrical communication with the radiofrequency coil.

In another embodiment, resonant portion also further includes a second complex impedance, a fourth switch, and a fifth switch. The second complex impedance can include an input in electrical communication with the input of the resonant portion. The fourth switch can include a first input, a second input and an output. The first input can be electrical communication with the processor. The second output can be in electrical communication with an output of the second complex impedance. The output can be in electrical communication with ground. The fifth switch can include a first input, a second input, a third complex impedance, and an output. The first input can be in electrical communication with the processor. The second input can be in electrical communication with the input of the resonant portion. The output can be in electrical communication with an input of a third complex impedance. The third complex impedance can include an output in electrical communication with an input/output of the RF coil. The processor can be further configured to command the second and third switches to open and close to shift a resonant frequency of an oscillator formed by resonant portion.

In another embodiment, the data signal can be operative to cause the processor to command the sensor to cease output of the sensor measurement signal.

In another embodiment, the data signal can be operative to cause the processor to command the sensor change an interval between respective transmissions of the sensor measurement signal.

In another embodiment, the data signal can be operative to cause the processor to change a power of the carrier signal.

In another embodiment, the data signal can be operative to cause the processor to command the circuit to transmit the sensor measurement signal upon receipt of the data signal.

DESCRIPTION OF DRAWINGS

These and other features will be more readily understood from the following detailed description taken in conjunction with the accompanying drawings, in which:

FIGS. 8A-8B are diagrams illustrating operating environments employing coil rotation for determining location in a beacon mode of operation. (A) Maximum received signal geometry. (B) Minimum (null) received signal geometry.

Figure 1:
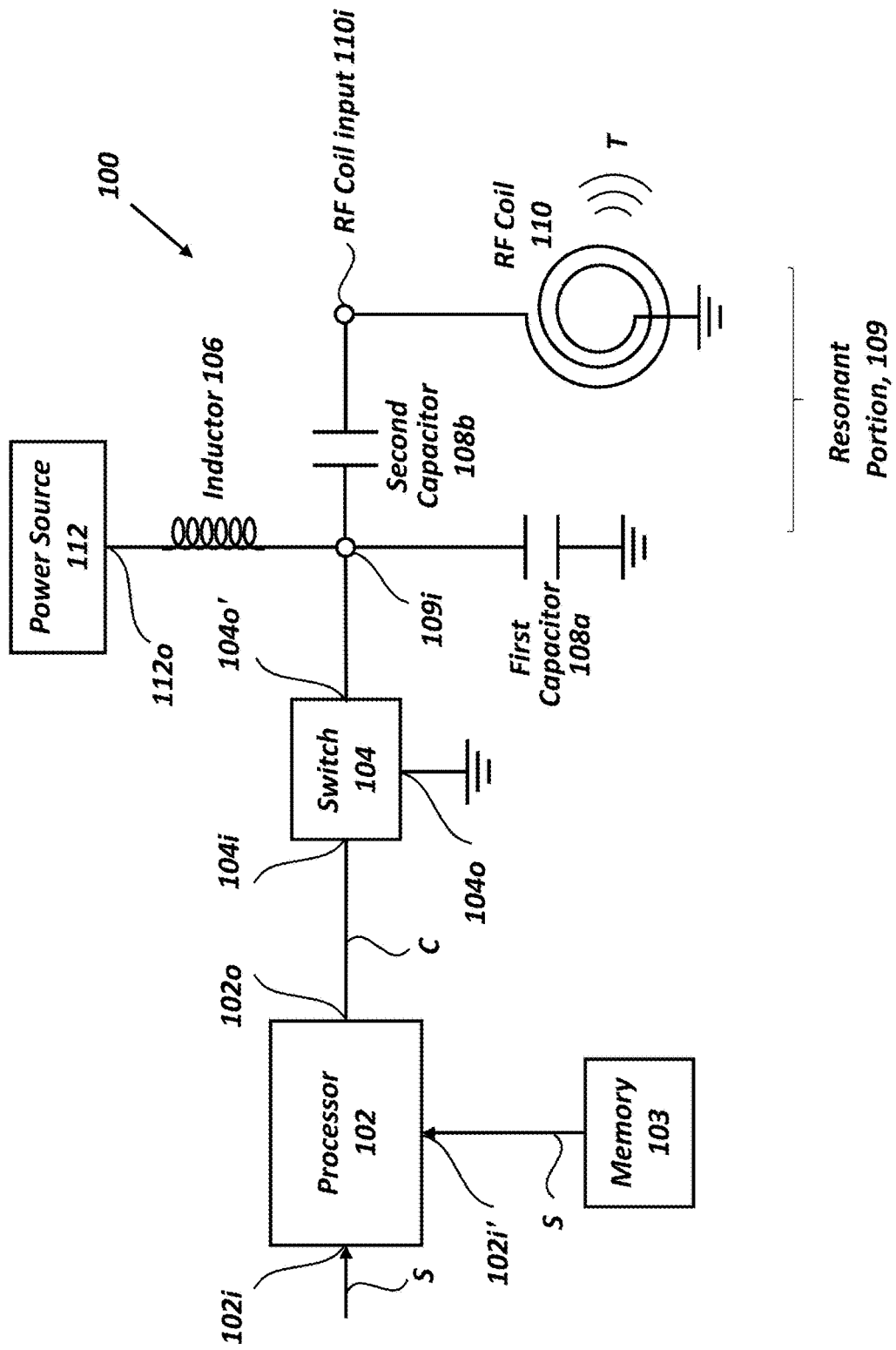
FIG. 1 is a diagram illustrating one exemplary embodiment of a one-way (transmit only) communication circuit.

It is noted that the drawings are not necessarily to scale. The drawings are intended to depict only typical aspects of the subject matter disclosed herein, and therefore should not be considered as limiting the scope of the disclosure.

DETAILED DESCRIPTION

In agriculture, sensing systems have been developed to communicate measurements of soil conditions (e.g., temperature, moisture, salinity, etc.) from below-ground sensors to above-ground receivers. As an example, a measurement system including a sensor and a wireless transmitter are installed below ground. Measurement data acquired by the sensor are received by the transmitter and in turn, wirelessly transmitted to an above ground receiver. Once received by the above ground receiver, the measurement data can be stored locally and/or forwarded to a network.

However, existing systems of this type are limited. As an example, the below ground unit is configured for transmission only, also referred to as a below ground transmit only (BGTO) unit. The above ground unit is configured for reception only, also referred to as a above ground reception only (AGRO) unit. As a result, the transmission behavior of the BGTO is fixed at the time of installation via firmware. Thus, the BGTO essentially operates autonomously and independently of the AGRO, and can only be altered via instructions triggered by the sensor measurements (e.g., curtailing a measurement interval when soil is cold and plant growth has ceased).

As discussed in detail below, an improved two-way communication system is described that provides transmission and reception capability. In one embodiment, the two-way communication system can be employed in the below ground unit, referred to as below ground transmit and receive (BGTR) unit. In another embodiment, the two-way communication system can also be employed in the above ground transmit and receive (AGTR), respectively. The ability of the BGTR to receive updated instructions operative to modify transmission behavior of the BGTR after initial deployment can provide a variety of added functionality, including on-demand transmission and bug fixes, as well as improved battery life.

Embodiments of the disclosed two-way communication systems and corresponding methods are discussed herein in the context of measurement of soil conditions for agricultural applications. However, embodiments of the disclosure can be employed with any sensor in any sub-surface environment and/or application without limit. Examples of other applications for the disclosed embodiments can include, but are not limited to, pipelines (e.g., oil and gas), buried tank leak detection/monitoring, structural integrity monitoring (e.g., dams, canals, levies, etc.), monitoring concrete curing, monitoring ballast materials under road beds, traffic monitoring.

In order to better understand the improvements and corresponding benefits provided by embodiments of the disclosed two-way communication system, a block diagram illustrating a circuit of an existing one-way below ground transmission only (BGTO) unit 100 is discussed with respect to FIG. 1. As shown, the BGTO unit 100 includes a processor 102 (e.g., a microcontroller), a memory 103, a switch 1004, a resonant portion 109, and a power source 112.

The processor 102 can be configured to receive a measurement signal S at an input. The measurement signal can be received directly from a sensor (not shown) via a first input 102$i$, received from the memory via second input 102$i'$, or combinations thereof. An output 102$o$ of the processor 102 can be connected to an input 104$i$ of the switch 104.

The switch 104 further includes a first output 104$o$ and a second output 104$o'$. The first output 104$o$ is connected to ground. The second output 104$o'$ is connected to an input 109$i$ of the resonant portion 109. The input 109$i$ is further in communication with the inductor 106. The first output 104$o$ of the switch 104 is connected to ground. The switch 104 is configured to move between an open position and a closed position in response to commands from the processor 102. As an example, the processor can provide command signals C to the switch 104 at the input 104i. In certain embodiments, the switch 104 can be a transistor.

In an embodiment, the power source 112 can be a battery or other source of DC power. As an example, the power source 112 can be configured to provide voltage within the range from about 1.5 V to about 15 V and current from about 10 mA to about 500 mA, depending on the desired transmit power level. The inductor 106 is interposed between the output 112o of the power source 112 and the junction 105.

The resonant portion 109 includes a first capacitor 108a, a second capacitor 108b, and a radiofrequency (RF) coil 110. The first capacitor 108a is connected at one end to the input 109i of the resonant portion 109 and at the other end to ground. The second capacitor 108b is connected at one end to the input 109i of the resonant portion 109 and at the other end to an input 110i of the RF coil 110.

When the switch 104 is closed, current flows from the power source 112, through the inductor 106, through the switch 104 to ground. When the switch 104 is open the energy in the inductor 106 couples into the first and second capacitors 108a, 108b, and the RF coil 110, which behaves electrically as an inductor.

The command signal C can be a square wave which produces a simple on-off cycle in the switch 104. A switch closure frequency $f_o$, the capacitance of the first and second capacitors 108a, 108b, and the inductance of the RF coil 110 can be selected such that a sinusoidal voltage signal is applied to the RF coil 110 with high energy efficiency. The oscillating voltage across the RF coil 110 gives rise to an oscillating current, also referred to herein as a carrier signal $f_c$. The carrier signal $f_c$ produces an oscillating magnetic field, referred to herein as a transmission signal T, which can be received by a receiver (e.g., an AGRO unit, not shown). By suitable variation in the command signal C and the carrier signal $f_c$, the transmission signal T, can be modulated to carry data, such as measurement data received by the processor 102 from a sensor.

One feature of this approach is that, for convenient sizes of the RF coil 110 and communication ranges, the coil size is typically over 3 inches in diameter and requires hundreds of volts across the RF coil 110 to generate an carrier signal with sufficient amplitude to produce a transmission signal T that can be received by the AGRO unit. The voltage at the input 109i of the resonant portion 109 is also generally fairly high (often well in excess of 20V).

As noted above, it can be desirable to add reception capability to the BGTO unit 100 of FIG. 1. In one approach, this can be accomplished by adding a second circuit including a second RF coil to provide the reception capability. However, this configuration is not desirable for a number of reasons. First, the two coils can couple and affect each other strongly when close (e.g., at separation distances less than a couple of coil diameters), influencing transmission and reception by the respective RF coils. While this coupling can be addressed by separating the respective RF coils at a larger distance, this added separation increases the size of the resulting transmit/receive unit. Second, the additional RF coil and circuitry can significantly increase the cost and complexity of production and assembly.

In another approach, receive capability can also be added to the BTGO unit 100 of FIG. 1 by adding an amplifier within a tuned LC "tank circuit" formed by the resonant portion 109. For effective signal transmission, the resonant portion 109 must satisfy the following equations:

$$f1 = \frac{1}{2\pi\sqrt{C108b * L110}} \quad \text{Eq. 1}$$

$$f2 = \frac{1}{2\pi\sqrt{Cs * L110}} \quad \text{Eq. 2}$$

$$\frac{1}{Cs} = \frac{1}{C108a} + \frac{1}{C108b} \quad \text{Eq. 3}$$

$$f1 < f, \quad f2 > f \quad \text{Eq. 4}$$

where C108a is the capacitance of the first capacitor 108a, C108b is the capacitance of the second capacitor 108b, Cs is the effective capacitance of the first and second capacitors 108a, 108b in series, L110 is the inductance of the RF coil 110, f is the desired transmission frequency f1 and f2 are frequencies. In general, the closer f1 and f2 approach f, the greater the transmit signal T, limited by the non-ideal properties of the components. When these relations are satisfied, it is possible to efficiently convert energy from the power source 112 to transmission signal T in the form of a high voltage across the RF coil 110.

To receive an incoming signal from the above ground unit, it is desirable that the structure formed by the inductor 106 and the resonant portion 109 is resonant at the transmission frequency f. This would allow an amplifier and demodulator to be used at either the input 109i of the resonant portion 109, or preferably, the input 110i to the RF coil 110, to receive the incoming signal. By making this resonant at the transmission frequency f, the required amplifier gain can be reduced and the resultant system can strongly reject signals that are not at the transmission frequency due to the narrow bandwidth. That is, a "tank" circuit is created at the desired reception frequency.

Two significant challenges arise when attempting to achieve this goal. In one aspect, it is not practically possible to simultaneously satisfy the transmission equations 1-4 while also creating a resonant structure for receiving at the transmission frequency. In another aspect, during transmission, the voltage in the circuit can be hundreds of volts AC. It is very difficult to integrate an amplifier into this circuit that can amplify very small (potentially sub-millivolt signals), while tolerating the hundreds of volts during transmission and not affecting the carefully tuned elements needed for transmission and reception.

Embodiments of the present disclosure provide solutions to these challenges by modifying the circuit of the BGTO unit 100 of FIG. 1 to include additional reactive elements and switches (FIG. 2) to provide a two-way transmit and receive unit 200, also referred to herein as transceiver system 200. As discussed in greater detail below, the transceiver system 200 can be employed as a below ground transmit and receive (BGTR) unit, an above ground transmit and receive (AGTR) unit, and combinations thereof.

As shown, the transceiver system 200 is modified with respect to the BGTO unit 100 to include a first switch 204, a second switch 207, a third switch 219, resonant portion 232, an amplifier 221, and a demodulator 222. The resonant portion 232 differs from the resonant portion 109 by the addition of a complex impedance 218, which can become part of the resonant portion 232 when the switch 219 is closed. Components in common between the transceiver system 200 and the BGTO unit 100 (e.g., processor 102, memory 103, inductor 106, power source 112) are provided as discussed above, unless otherwise noted.

The first switch 204 includes an input 204*i*, a first output 204*o* and a second output 204*o*'. The input 204*i* is connected to a first output 102*o*-1 of the processor 102. The first output 104*o* is connected to ground. The second input 204*i*' is connected to the inductor 106. The first switch 204 is configured to move between an open position and a closed position in response to first command signals C1 received from the processor 102 via the input 204*i*. In certain embodiments, the first switch 204 can be a transistor.

The second switch 207 includes a first input 207*i*, a second input 207*i*', and an output 207*o*. The first input 207*i* is connected to a second output 102*o*-2 of the processor 102. The second input 207*i*' is interposed between the inductor 106 and the second output 204*o*' of the first switch 204. The output 207*o* of the second switch 207 is connected to the input 109*i* of the resonant portion 232. The second switch 207 is configured to move between an open position and a closed position, with respect to the first input 207*i* and the output 207*o* of the complex impedance 219, in response to second commands signals C2 received from the processor 102 via the first input 207*i*. In certain embodiments, the second switch 207 can be a transistor.

The complex impedance 218 includes an input 218*i* and an output 218*o*. The input 218*i* is connected to the RF coil 110 (e.g., an RF coil input/output 110*io*), and the output 218*o* is connected to an input 219*i*' of the third switch 219. While the complex impedance 218 is generalized in FIG. 2 as a single component, it can be understood that the complex impedance 218 can include one or more components, such as resistors, capacitors, inductors, or any combination thereof. The components can have fixed or adjustable electrical parameters (e.g., capacitance, inductance, impedance). Examples of adjustable components of the complex impedance can include a tunable capacitors or dip switches with multiple fixed capacitors that allow for a changing effective impedance.

The third switch 219 includes a first input 219*i*, a second input 219*i*', and an output 219*o*. The first input 219*i* is connected to a third output 102*o*-3 of the processor 102. The second input 219*i*' is connected to output 218*o* of the complex impedance 218. The output 2190 of the third switch 219 is connected to ground. The third switch 219 is configured to move between an open position and a closed position (with respect to the input 219' and the output 2190 of the complex impedance 219) in response to third commands signals C3 received from the processor 102 via the first input 219*i*. In certain embodiments, the third switch 219 can be a transistor.

The amplifier 221 can include an input 221*i* and an output 221*o*. The input 221*i* is in communication with the output 218*o* of the complex impedance 218 (e.g., interposed between the output 218*o* of the complex impedance 218 and the second input 219*i*' of the third switch 219). The output 2210 of the amplifier 221 is in communication with an input 222*i* of the demodulator 222. An output 222*o* of the demodulator 222 is in communication with a third input 102*i*''' of the processor 102. The amplifier 221 and the demodulator 222 can be employed to receive instruction data ID from the resonant portion 232 when the transceiver system 200 operates in a reception mode, demodulate the instruction data ID, and provide the instruction data ID to the processor 102.

Figure 3:
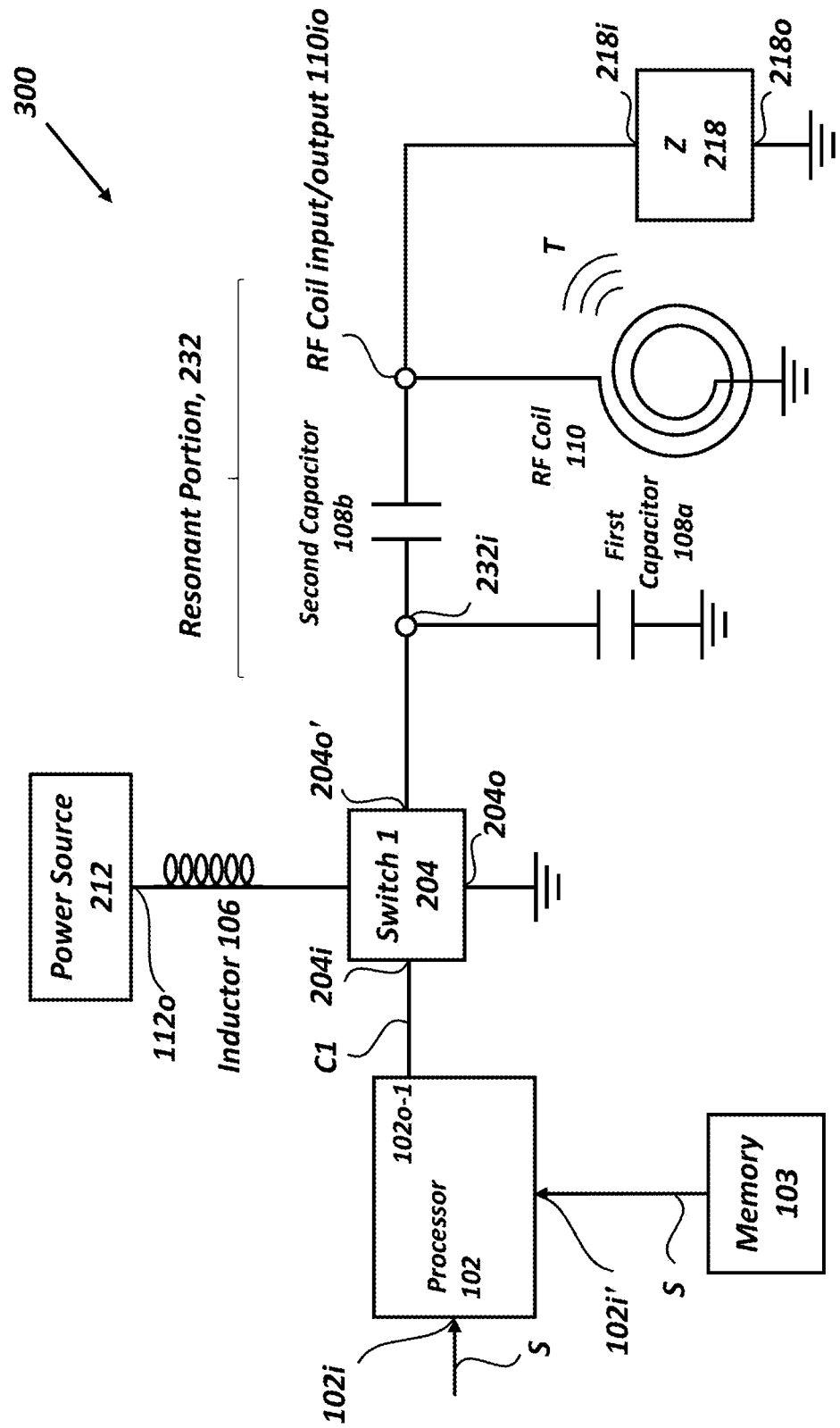
FIG. 3 is a diagram illustrating an effective transmission circuit provided by the two-way communication system of FIG. 2 in a transmission configuration.
Figure 4:
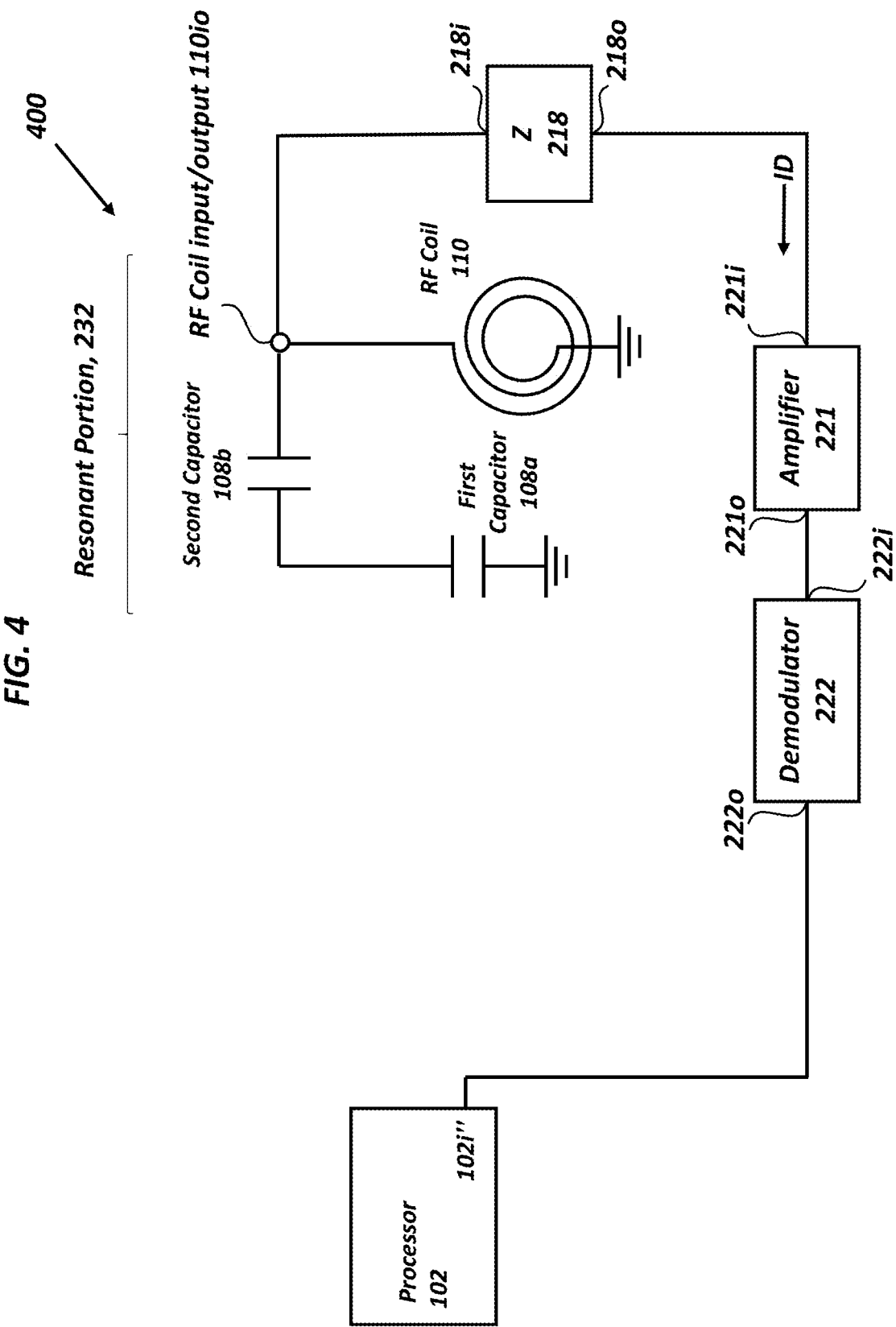
FIG. 4 is a diagram illustrating an effective reception circuit provided by the two-way communication system of FIG. 2 in a reception configuration.

To operate in a transmission configuration, the processor 102 commands the second switch 207 and the third switch 219 to close via command signals C2 and C3. A diagram of an effective transmission circuit 300 resulting from closure of the second and third switches is illustrated in FIG. 3. To operate in a reception configuration, the processor 102 commands the second switch 207 and the third switch 219 to open via command signals C2 and C3. A diagram of an effective reception circuit 400 resulting from opening the second and third switches is illustrated in FIG. 4.

Closure of the second switch 207 in the transmission configuration allows electrical communication between the power source 212, the inductor 106, and the resonant portion 232. Closure of the third switch C3 holds the amplifier input 221*i* at ground. This protects the amplifier 221 from input of high voltage from the RF coil 110 during transmission, as discussed below. Isolation of the amplifier 221, in turn, substantially reduces or negates effect of the amplifier 221 on the tuning needing for effective transmission. The amplifier 221 and demodulator 222 are not shown in FIG. 3, as they have substantially no effect on operation in the transmission configuration. Thus, the effective transmission circuit 300 of FIG. 3 is analogous to the transmission circuitry of the BGTO unit 100 of FIG. 1, with addition of the complex impedance 218 in parallel with the RF coil 110.

The transmission signal T can be generated by the transceiver system 200 in a similar manner to that discussed with respect to FIG. 1 when the second and third switches 207, 219 are closed. The processor 102 commands the first switch 204 to turn on and off to transmit. When the first switch 204 is closed (e.g., in response to first command signals C1 from the processor 102), current flows from the power source 112, through the inductor 106, to the input 232*i* of the resonant portion. The energy in the inductor 106 couples into the first and second capacitors 108*a*, 108*b*, and the RF coil 110, which behaves electrically as an inductor. When the first switch 204 is open, input 232*i* of the resonant portion 232 is coupled to energy stored in the inductor 106, causing the resonant portion 232 to oscillate.

The first command signal C1 can be a square wave which produces a simple on-off cycle in the first switch 204. The switch closure frequency $f_o$, the capacitance of the first and second capacitors 108*a*, 108*b*, the inductance of the RF coil 110, and the impedance 218 (which is part of the resonant portion 232 when the switch 219 is closed in the transmit configuration) can be selected such that a sinusoidal voltage signal is applied to the RF coil 110 with high energy efficiency. The oscillating voltage across the RF coil 110 gives rise to an oscillating current, the carrier signal $f_c$. The carrier signal $f_c$, produces an oscillating magnetic field, the transmission signal T, that can be received by a receiver (e.g., an AGRO unit, not shown). By suitable variation in the command signal C, and the carrier signal $f_c$, the resultant transmission signal T can be modulated to carry data, such as measurement data received by the processor 102 from the sensor.

In this transmission configuration, using appropriate values for the components of the resonant portion 232 (e.g., capacitance of the first capacitor 108*a* and the second capacitor 108*b*, the inductance of the RF coil 110, and the impedance of the variable impedance 218), it is possible to achieve the required conditions for effective high transmit voltage of the RF coil 110. The capacitance of the first capacitor 108*a* can be selected from about 100 pF to about 10,000 pF. The capacitance of the second capacitor 108*b* can be selected from about 100 pF to about 10,000 pF. The inductance of the RF coil 110 can be selected from about 0.1 mH to about 10 mH. The impedance of the complex impedance 218 can be selected from about +10,000 i ohms to about −10,000 i ohms.

Opening the third switch 219 permits electrical communication between the RF coil input/output 110*io* and the input 221i of the amplifier 221, through 218. This reception configuration exposes the amplifier 221 to any received oscillating signals formed by the resonant portion 232 (which is formed from the first capacitor 108a, the second capacitor 108b, and the RF coil 110 as the second switch 207 and the third switch 219 are open and the input impedance of the input 221i of the amplifier 221 is relatively high), such as instruction data ID. Opening the second switch 207 in the reception configuration further inhibits electrical communication between the power source 212 and inductor 106 with the resonant portion 232. Accordingly, the power source 212 and inductor 106, along with the first switch 204 and the second switch 207, are not shown in FIG. 4, because they have no effect on reception. As discussed below, it is possible to simultaneously achieve the appropriate tuning required for transmission and also an appropriately tuned tank circuit for reception.

The conditions for effective transfer of a high voltage to the transmitting current in the transmission configuration is similar to the earlier conditions illustrated in Equations 1-4:

$$f1 = \frac{1}{2\pi\sqrt{C108b * Lp}} \quad \text{Eq. 5}$$

$$f2 = \frac{1}{2\pi\sqrt{Cs * L110}} \quad \text{Eq. 6}$$

$$\frac{1}{Cs} = \frac{1}{C108b} + \frac{1}{C108a} \quad \text{Eq. 7}$$

$$\frac{1}{Lp} = \frac{1}{L110} + \frac{1}{L218} \quad \text{Eq. 8}$$

$$f1 < f, \quad f2 > f \quad \text{Eq. 9}$$

where L218 is the inductance of the complex impedance 218 and $L_p$ is an inductance that can be used to simultaneously achieve optimum transmit and receive characteristics in one overall circuit employing a single RF coil for both signal transmission and reception. In certain embodiments, $L_p$ can be selected from the range of about 1 mH to about 10 mH.

With regards to the effective reception circuit 400, the impedance of the amplifier 221 in the reception configuration can be made quite high compared to the other circuit elements and can be ignored. For effective reception, the resonant portion 232 needs to be resonant at the reception frequency, f. This condition is expressed as:

$$f = \frac{1}{2\pi\sqrt{Cs * L110}} \quad \text{Eq. 10}$$

$$\frac{1}{Cs} = \frac{1}{C108a} + \frac{1}{C108b} \quad \text{Eq. 11}$$

As there are three degrees of freedom, C108a, C108b, and L218, it is possible to simultaneously satisfy Equations 9 and 10 and achieve optimum reception combined with efficient transmission.

Figure 5:
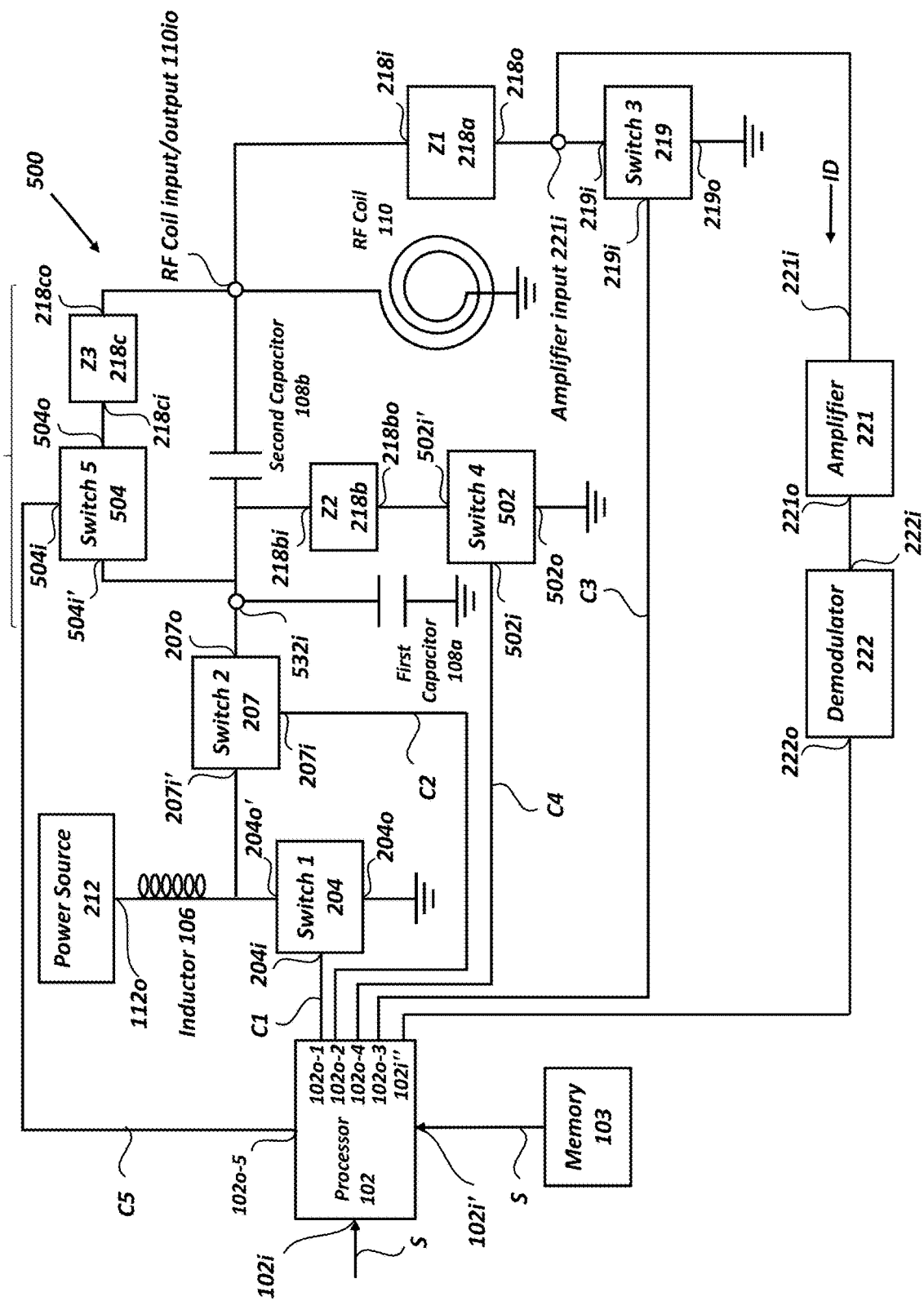
FIG. 5 is a diagram illustrating an alternative embodiment of the two-way communication system of FIG. 2.

In an alternative embodiment, the resonant portion 232 of the transceiver system 200 can be provided in the form of transceiver system 500 to facilitate shifting the resonant frequency. As shown in FIG. 5, the transceiver system 500 is modified from the transceiver system 200 by adding a second complex impedance 218b, a third complex impedance 218c, a fourth switch 502, and a fifth switch 504. For clarity, the complex impedance 218 is renumbered as first complex impedance 218a. Similar to the first complex impedance 218a, while the second and third complex impedance 218b, 218c are generalized as a single component in FIG. 5, it can be understood that the second and third complex impedance 218b, 218c can include one or more components, such as resistors, capacitors, inductors, or any combination thereof. The components can have fixed or adjustable electrical parameters (e.g., capacitance, inductance, impedance).

The second complex impedance 218b includes an input 218bi and an output 218bo. The input 218bi is connected to an input 532i of the resonant portion 532 and the output 218bo is connected to a second input 502i' of the fourth switch 502. The impedance of the second complex impedance 218b can be selected from about 10,000 i ohms to about −10,000 i ohms.

The fourth switch 502 includes a first input 502i, the second input 502i', and an output 502o. The first input 502i is connected to a fourth output 102o-4 of the processor 102, and the second input 502i' is connected to the output 218bo of the second complex impedance 218b. The output 502o is connected to ground. The fourth switch 502 is configured to move between an open position and a closed position in response to fourth commands signals C4 received from the processor 102 via the first input 502i. In certain embodiments, the fourth switch 502 can be a transistor.

The fifth switch 504 includes a first input 504i, the second input 504i', and an output 504o. The first input 504i is connected to a fifth output 102o-5 of the processor 102, and the second input 502i' is connected to the input 532i of the resonant portion 532 (e.g., interposed between the input 532i of the resonant portion 532 and the input 218bi of the second complex impedance 218b). The output 504o of the fifth switch 504 is connected to an input 218ci of the third complex impedance 218c. The fifth switch 504 is configured to move between an open position and a closed position in response to fifth commands signals C5 received from the processor 102 via the first input 504i. In certain embodiments, the fifth switch 504 can be a transistor.

The third complex impedance 218c includes an input 218ci and an output 218co. The output 218co is connected to the RF coil input/output 110io. The impedance of the third complex impedance 218c can be selected from about 10,000 i Ohms to about −10,000 i Ohms.

The third complex impedance 218c, under control of the fifth switch 504 can be used to modify the effective impedance of the second capacitor 108b (when the fifth switch is closed) by adding in parallel the third complex impedance when the fifth switch 204 is closed or by removing the third complex impedance 218c when the fifth switch 504 is open. Likewise, the second complex impedance 218b can be used to modify the effective impedance of the first capacitor 108a. With these additions, it is also possible to satisfy the constraints for effective transmission and reception by suitable combinations of switch positions.

Figure 6:
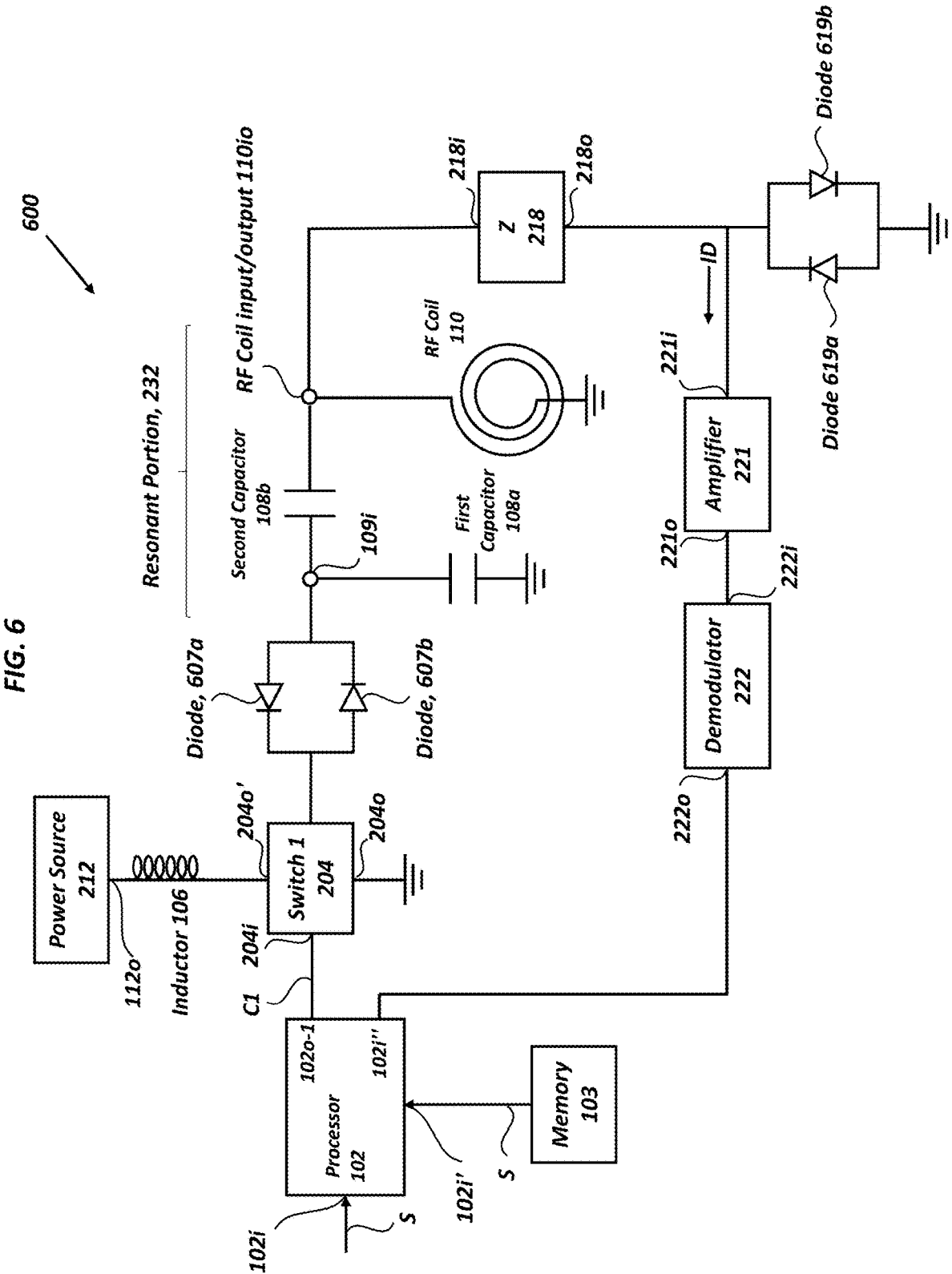
FIG. 6 is a diagram illustrating another alternative embodiment of the two-way communication system of FIG. 2.

Embodiments of the transceiver systems 200, 500 can be further modified to replace at least one of the second switch 207 and the third switch 219 with diodes. FIG. 6 illustrates a transceiver system 600 which modifies the transceiver system 200 to replace the second switch 207 and the third switch 219 with diodes. As shown, diodes 507a, 507b replace the second switch 207 and diodes 519a, 519b replace the third switch 219.

This modification can simplify the transceiver system 600 as compared to the transceiver system 200. In general, diodes exhibit little current flow when subject to a forward voltage below their intrinsic forward voltage drop (typically from about 0.1 to 1V) and very high current flow at voltages above this. During transmission, when the first switch 204 is opened and closed (turned on and off), the voltage across the diodes 607a, 607b is relatively high (e.g., about 10 V or greater), such that the diodes 607a, 607b mimic the closed second switch 207. Similarly, the diodes 519a, 519b act like a closed switch (e.g., the third switch 219) and limit the voltage into the amplifier 221 to a volt or less, substantially preventing any adverse issues with the amplifier 221.

When the transmission is off (the first switch 204 in the open position), the RF coil 110 is exposed to the oscillating magnetic field of a transmitter, which induces a small voltage in the circuit (e.g., on the order of about 1 mV to about 100 mV). Under these low voltages, the diodes 607a and 607b, as well as 619a and 619b, act like closed switches (e.g., the second switch 207 and the third switch 219, respectively), as they present a very high impedance to a low voltage. Furthermore, the amplifier 221 sees the full received AC signal at the input 221i because the impedance of the amplifier 221 is very high compared to the impedance of the complex impedance 218. As a result, the voltage at the input 221i of the amplifier 221 is approximately the same as that at the RF coil input/output 110io.

An embodiment of the transceiver system 600 has been implemented in hardware and signals of over 200V AC were generated across the RF coil 110 when in the transmitting configuration. In the reception configuration, the transceiver system 600 is capable of receiving and demodulating an oscillating signal from a transmitter over 7 m distant. Beneficially, this demonstrates that very low cost diodes 607a, 607b, 619a, 619b can successfully replace the second and/or third switches 209, 219. Furthermore, no control of switches by the processor 102 is needed.

Figure 7:
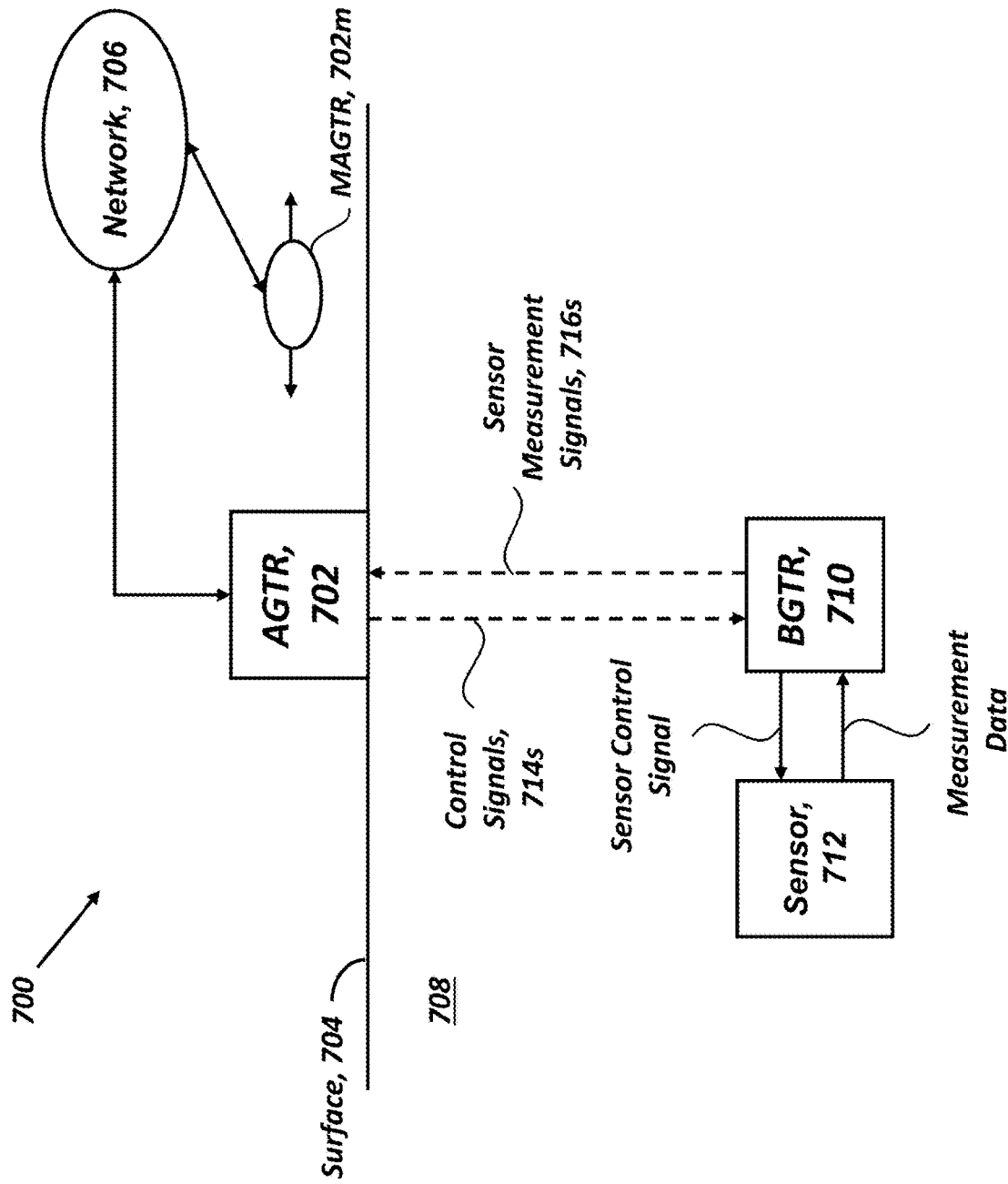
FIG. 7 is a diagram illustrating an operating environment including an above ground transmit and receive (AGTR) unit and a below ground transmit and receive (BGTR) unit.

FIG. 7 is a block diagram illustrating an operating environment 700 employing embodiments of the transceiver system discussed above. As shown, an above ground transmit and receive (AGTR) unit 702 is positioned above a surface 704 of a material 708 (e.g., soil, concrete, water, etc.) and is in communication with a network 706. A below ground transmit and receive (BGTR) unit 710 is positioned below the surface 704 and is in communication with one or more sensors (collectively represented as sensor 712). Embodiments of the AGTR unit 702 and the BGTR unit 710 can include an embodiment of the transceiver system 200, 500, or 600.

The one or more sensors 712 are in communication with the BGTR unit 710 and can be configured to measure one or more parameters of the material 708. As an example, when the material 708 is soil, the sensor(s) 712 can be configured to measure soil parameters such as moisture, salinity, and/or temperature. When the material 708 is a different media (e.g., concrete, water, etc.), other parameters can be measured by the sensor(s) 712. Examples of such parameters can include, but are not limited to, light level, fluid flow rate, vibration amplitude, and the like.

In use, the BGTR unit 710 can execute instructions operative to control acquisition of respective measurement data by the sensor 712, to control wireless transmission of measurement data received from the sensor 712 to the AGTR unit 702 (measurement signals 716s), and combinations thereof. As discussed above, without reception capability, the below ground unit can be limited to executing instructions received prior to deployment below ground. However, a variety of added functionality can be implemented when the below ground unit includes the ability to receive updated instructions.

Updated instructions received by the BGTR unit 710 can be operative to perform one or more of the following:

Increasing a first time interval between respective measurements acquired by the sensor 712, alone or in combination with increasing a second time interval between transmission of respective sensor measurement signals 716s by the BGTR unit 710. It can be beneficial to increase the first and/or second time intervals during irrigation in order to better capture important soil properties (e.g., water infiltration rates).

Decreasing the first time interval between respective measurements acquired by the sensor 712, alone or in combination with decreasing the second time interval between transmission of respective sensor measurement signals 716s by the BGTR unit 710. It can be beneficial to decrease the first and/or second time intervals when the rate of change of measured parameters is anticipated to be relatively low (e.g., after a crop has been harvested, during the fallow season, etc.) in order to conserve the lifetime of the power source 112 (e.g., a battery).

Updating firmware of the BGTR unit 710 to allow for bug fixes in software and/or instructions executed by the BGTR unit 710. In general, existing BGTO units (e.g., 100) are sealed to prevent water intrusion. Thus, even if a BGTO unit 100 were removed from below ground, there is no practical mechanism for updating its firmware.

The ability of the BGTR unit 710 to receive control signals 714s can further enable the following functionality:

The BGTR unit 710 can periodically receive a control signal 714s from the AGTR unit 702 providing a notification that the AGTR unit 702 is present. (e.g., an "I'm here!" message). If the AGTR unit 702 is removed from the field, the BGTR unit 710 can instruct the sensor 712 to cease measurement and further cease transmission of sensor measurement signals 716s to increase battery life.

The AGTR unit 702 can measure the strength of the sensor measurement signals 716s transmitted by the BGTR unit 710. If the strength is sufficiently high, the AGTR unit 702 can transmit a control signal 714 instructing the BGTR unit 710 to reduce the transmit power and hence increase battery life of the BGTR unit 710.

The BGTR unit 710 can periodically receive a control signal 714s from the AGTR unit 702 instructing the BGTR unit 702 to transmit a sensor measurement signal 716s upon receipt. In this manner, "on demand" soil data acquisition can be accomplished.

The ability of the AGTR unit 702 to command the BGTR unit 710 to make an on demand measurement and transmit the result can facilitate applications where the AGTR unit 702 is not fixed in the field close to a single (or multiple) BGTR units 710. As an example, an AGTR unit 702 can be placed on a piece of farm equipment such as a tractor, on a center pivot boom arm, or on a ground or aerial drone. This opens up the ability of a mobile AGTR unit (MAGTR unit 702s) to cover a large number of fixed BGTR units 710, and hence a large physical footprint.

Without the ability of two-way capability on the BGTR unit 710 and the MAGTR unit 702m, the mobile above ground unit would be required to linger over the below ground unit until a regularly scheduled measurement and transmission occurs. For context, in order to conserve battery life, the measurement/transmission interval is typically in the range of about 10-60 minutes. In existing systems, this can force the above ground unit to remain in the vicinity of the below ground unit for up to one hour, making data acquisition difficult and time consuming. With two-way communication the MAGTR unit 702*m* can arrive at the vicinity of the BGTR unit 710, send a message to the BGTR unit 710 to initiate a measurement/transmission cycle, receive the measurement data, and then start on the way to another BGTR unit 710 with roughly 5 seconds of dwell time at each location. The MAGTR unit 702*m* can then send the received measurement data to the network 706 using a conventional radio immediately or wait until it returns to a home location where other options are available for upload to the network 706.

Beacon Mode

Besides transmitting data, embodiments of the transceiver systems discussed herein (e.g., 200, 500, 600, 700) can be employed to convey location information for use in recovering a BGTO or BGTR, place an above-ground AGRO or AGTR close enough to the below ground unit for reliable reception, and as an aide in mobile above ground receiver (MAGTR) applications.

Figure 2:
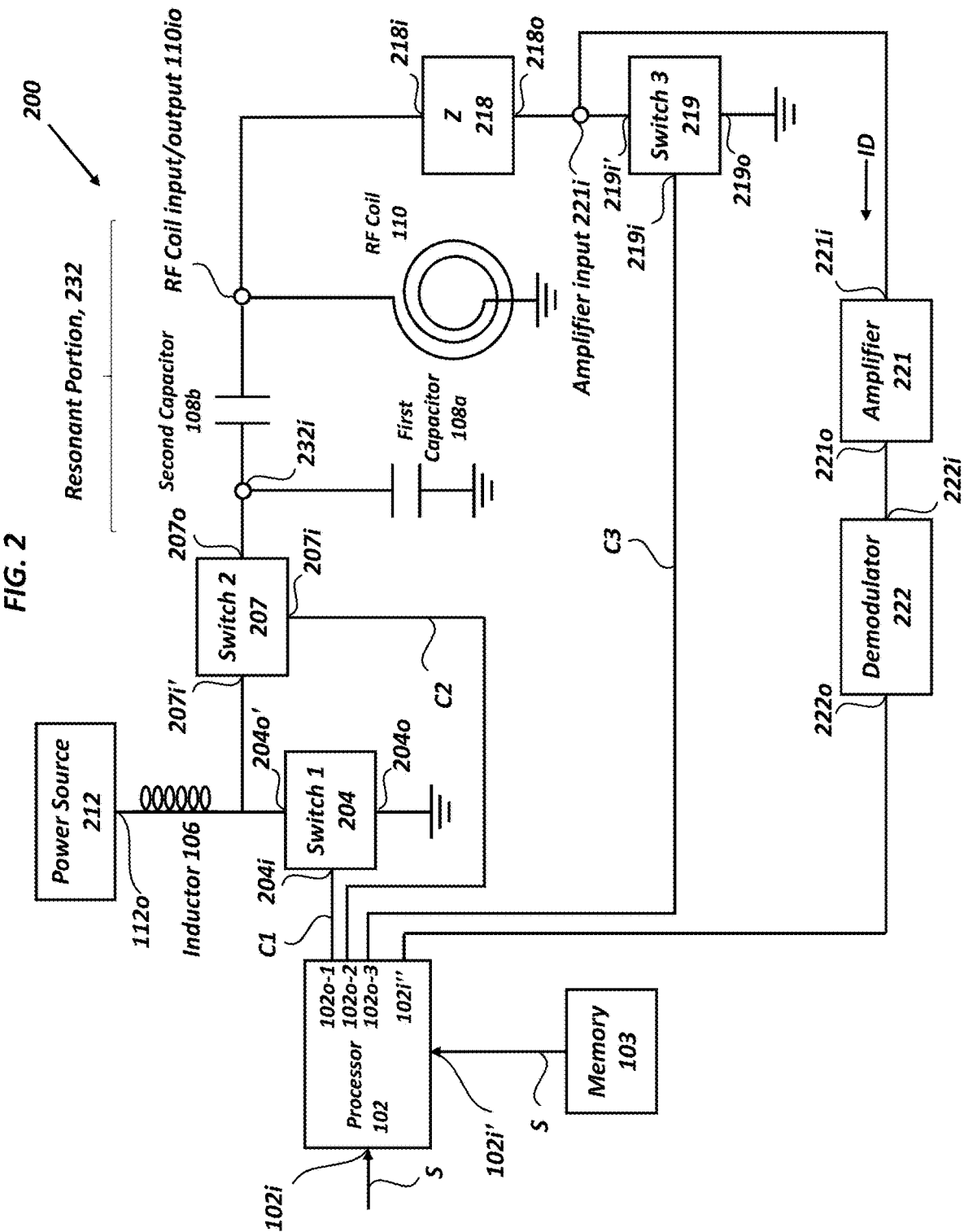
FIG. 2 is a diagram illustrating one exemplary embodiment of a two-way (transmit and receive) communication system.

With further reference to the transceiver system 200 of FIG. 2, a beacon signal can be generated by controlling the first switch 204. In order to provide a concrete example of an implemented system, during data transmission, the first switch 204 is turned on/off at a predetermined switch closure frequency to generate a sinusoidal signal having a high amplitude across the RF coil 110. As an example, a switch closure frequency of about 174 kHz can generate a sinusoidal 174 kHz signal of 100's of volts across the RF coil 110. Using an on-off keying, a "1" is sent by closing the first switch 204 for a predetermined time (e.g., about 1 ms) and "0" is sent by opening the first switch 204 for a predetermined time (e.g., about 1 ms). During data reception, The receiver formed by the amplifier 221 and the demodulator 222 converts a received weak voltage received across the RF coil 110 into a logic input to the processor 102.

The reception distance can be in the range of about 5 m to about 20 m for a typical transmitted signal. Furthermore, the interval between sensor measurements and transmissions can be long (e.g., an hour or more). Thus, using regular data transmission for location is highly problematic. In one aspect, an interval of one hour between transmissions makes locating a below ground unit impractical, many hours can be required to locate the below ground unit, even with a rough GPS location. In another aspect, the extended range is problematic. At best, a relative location within about 5 m is provided, rather than a precise location. This is insufficient for recovering the below ground unit or to establish that an above ground receiver is within reliable communication range across varying environmental factors.

These two limitations can be overcome by using a beacon mode that sends one or more signals of varying power levels at frequent interval. The lower power levels can allow much more precise location (e.g., down to as low as about 10 cm or better) and more frequent signals allows for a quick determination of location once the general area of the below ground unit is established. The use of frequent signals can require very efficient battery utilization in order to allow the power source 212 (e.g., a battery) of the below ground unit to support operation for 5 years or more. Simple beacon routines that can operate autonomously of the processor 102 are also desirable to conserve battery power and offer additional flexibility.

Two approaches have developed for the locating pulse(s). The first approach employs a short train of 174 kHz on/off control of the first switch 204, which can be much shorter than the current 1 mS train time when sending data. In another aspect, a single closure of the first switch 204 having variable duration, referred to herein as hammering. In both cases, the resonant structure in the resonant portion 232 does not turn on immediately at maximum strength at the start of the switch closure train, but rather ramps up. An analogy for this first approach is that of pushing a swing with a series of pushes, where the amplitude of the swing slowly builds up with each push. Continuing this analogy, the swing need to be pushed at the right time (e.g., the right frequency), otherwise the amplitude doesn't build up much.

In the second approach using a single pulse (hammering), the energy from the pulse starts the transmitter oscillating at the natural frequency (e.g., 174 kHz) for a period of time as it decays from losses in the circuit. Additionally, the longer the pulse, the more energy is imparted and the stronger the oscillation. An analogy for this second approach is striking a bell with a hammer, causing it to ring at its natural frequency. A harder hit (in the case of a circuit, a longer pulse) generates a louder sound, but does not change the tone.

In both beacon approaches, the amplitude of the oscillation on the RF coil 110, and hence the transmit strength, can be made much smaller and the duration can be much shorter. These combine to produce an energy requirement for the beacon that is much smaller than typically used to send data, helping to converse battery life. The lower transmit intensity can reduce the reception range, which can provide more accurate localization of the below ground unit. For example, if the beacon pulse range is 1 m, the beacon can only be detected within 1 m of it. In contrast, with a typical transmission strength having a range of 5-20 m, the smallest localization that can be determined is within 5-20 m.

In alternative embodiments, it can be possible to increase the transmission strength by increasing the input voltage at the input 232*i* to the resonant portion 232. Conversely, the transmission strength can be decreased by decreasing the input voltage at the input 232*i* to the resonant portion 232).

It can be understood that, while 174 kHz has been discussed in examples above as the operating frequency, other values can be employed.

As an example of how power efficient these beacon pulses can be, embodiments of the transceiver system have been tested and, based upon the test results, it is projected that locating pulses can be generated every second for over 100 years on 4D cell batteries.

a) Series of Beacon Strengths

One approach developed to assist in locating the below ground unit employing a beacon mode, is to employ a series of two or more beacon pulses of different strength and duration. As an example, consider a series of three beacon pulses, staggered in time: pulse 1 at t=0 having high strength (e.g., 5 m range), pulse 2 at t=+10 ms having medium strength (e.g., 2 m range), Low—1 m, and pulse 3 at t=+2 ms with low strength (e.g., 1 m range). This series of pulses can be repeated at t=1000 ms (e.g., every second). The interval between the pulses is necessary to allow the previous beacon oscillation in the resonant portion 232 to fully decay before the next pulse starts.

A benefit of this approach is that, with an appropriate above ground unit (e.g., having firmware/software that can be user triggered to enter a "Hunt" mode), a given area can be quickly searched to find the below ground unit. In an exemplary use case, a user using an app on a smart phone or other portable computing device, selects a BGTO or BGTR to be located. The app retrieves the GPS location (e.g., from local storage or network-based storage) and guides the user to the rough location (e.g., within about 10 m). Subsequently, the user then triggers an AGRO or AGRT to enter "Hunt" mode and listens for feedback on whether one or more beacon pulses can be detected. The above ground unit can generate a feedback to the user such as beeping not at all, once, twice, or three times every second. The more beeps, the closer to the below ground unit is to the location of the user, providing intuitive feedback. With a rapid beacon cycle (e.g., 1s), the user can move quickly though a search radius around the nominal GPS location to locate the unit to about 1 m.

b) Precise Location Through Coil Rotation

While locating the below-ground unit within 1 m can be sufficient for monitoring and forwarding on the reported data, it can be too crude for effectively locating the below ground unit for removal. Notably, location within a 1 m radius can require digging a hole 2 m in diameter. To address this issue and effectively to locate the below ground unit to approximately 0.1 m, asymmetric transmit/receive geometry can be exploited.

FIGS. 8A-8B illustrate respective operating environments 800, 802 including AGTR 804 and BGTR 806. AGTR 804 is above a material 810 (e.g., soil) and includes coil 812 while BGTR 806 is embedded within the material 810 and includes a coil 814. AGTR 804 and BGTR 806 can be in the form of any of the transceiver systems 200, 500, 600, 700. The strength of a transmitted signal generated by AGTR 804 and received by BGTR 806 is highest when the AGTR coil 802 and the BGTR coil 804) face each other and their respective coil axes (812A and 814A) are parallel, as illustrated in FIG. 8A. In contrast, the strength of a transmitted signal generated by AGTR 804 and received by BGTR 806 is weakest (null condition) when the AGTR coil 802 and the BGTR coil 804) are directly above each other and their respective coil axes (812A and 814A) are orthogonal. In a typical install geometry, the axis 812A of the AGTR coil 812A can be fixed in place, orthogonal to a surface 816 of the material 810 and the axis 1608A of the BGTR coil 814 is parallel to the material surface 816 (FIG. 8B). Thus, the null condition occurs when the AGTR coil 812 is directly over the BGTR coil 814. With this configuration, it is possible to locate the BGTR 806 to within about 10 cm or better by noting when weakest beacon pulse stops being received.

c) Autonomous Beacon

When using a 174 kHz pulse train to generate a beacon signal, precise (1% or better) frequency tolerance can be required due to the need to closely match the resonant frequency of the transmitting circuitry. This condition can be hard to achieve without using a crystal based processor. However, the hammering approach to generating beacon signals can easily be implemented without a microprocessor. Instead, only an approximate interval between closure of the first switch 204 and rough durations of the switch closed times are necessary. This can be accomplished, for example by using a positive going pulse generator that generates a high pulse (e.g., a 2 µs pulse) every second that is used to control the first switch 204. These pulse generators can be extremely low power (on the order of 1 µA@3.3V) which is much less than what would be used for a microprocessor based solution.

The pulse generator can operate in conjunction with the processor 102. As an example, the transceiver system 200 can be modified by placing the output of the pulse generator in communication with the input 204i of the first switch 204. In this embodiment, the pulse generator is used to control the first switch 204 to generate a beacon pulse, with no commands from the processor 102 other than to disable the beacon pulse during actual data transmit.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:

1. A transceiver circuit, comprising:
a resonant portion including a single radiofrequency (RF) coil, wherein the resonant portion is configured for transmission and reception at about the same frequency;
a plurality of switches, including:
a first switch including an input in electrical communication a power source and an output in electrical communication with ground;
a second switch including an input interposed between the power source and the first switch and an output in electrical communication with an input of the resonant portion;
a third switch including an input in electrical communication with an output of the resonant portion and an output in electrical communication with ground;
a first complex impedance interposed between the output of the resonant portion and the input of the third switch;
an amplifier including an amplifier input interposed between the first impedance and the input the third switch;
a demodulator including an input in electrical communication with the amplifier output, and
a processor and a sensor in electrical communication with the processor, wherein the processor is configured to receive one or more sensor measurement signals output by the sensor, the one or more measurement signals including data characterizing at least one parameter of a subsurface material measured by the sensor;
wherein the processor is configured to:
command the second and third switches to close; and
command the first switch to open and close at a closure frequency that provides current from the power source to the radio frequency coil in the form of a carrier signal;
wherein the carrier signal is transmitted by the radiofrequency coil at a transmission frequency; and
wherein the amplifier and the demodulator are electrically isolated from the resonant portion when the second and third switches are closed.

2. The circuit of claim 1, wherein the carrier signal is a square wave representing at least a portion of the sensor measurement signal.

3. The circuit of claim 1, wherein a capacitance of the resonant portion, an inductance of the resonant portion, and the closure frequency are selected such that the carrier frequency is a sinusoid.

4. The circuit of claim 1, wherein the first impedance is a variable impedance configured to shift a resonant frequency of an oscillator formed by resonant portion and the first impedance to be approximately equal to the transmission frequency.

5. The circuit of claim 1, wherein:
the processor is configured to command the second and third switches to open such that an oscillating signal received by the radiofrequency coil is received at the input of the amplifier;
the amplifier is configured to amplify the received oscillating signal;
the demodulator is configured to receive the amplified oscillating signal, demodulate the amplified oscillating signal; and output a data signal generated from the demodulated amplified oscillating signal to the processor; and
the resonant portion is isolated from the power source when the second and third switches are open.

6. The circuit of claim 1, wherein at least one of the second and third switches is a diode.

7. The circuit of claim 1, wherein the resonant portion further comprises a first capacitor and a second capacitor.

8. The circuit of claim 7, wherein:
an input of the first capacitor is in electrical communication with the output of the second switch and an output of the first capacitor is in electrical communication with ground; and
an input of the second capacitor is in electrical communication with the output of the second switch and an output of the second capacitor is in electrical communication with the radiofrequency coil.

9. The system of claim 5, the resonant portion further comprising:
a second complex impedance including an input in electrical communication with the input of the resonant portion;
a fourth switch including:
a first input in electrical communication with the processor;
a second input in electrical communication with an output of the second complex impedance; and
an output in electrical communication with ground;
a fifth switch including:
a first input in electrical communication with the processor;
a second input in electrical communication with the input of the resonant portion;
and an output in electrical communication with an input of a third complex impedance; and
the third complex impedance including an output in electrical communication with a input/output of the RF coil;
the processor is configured to command the second and third switches to open and close to shift a resonant frequency of an oscillator formed by resonant portion.

10. The system of claim 5, wherein the data signal is operative to cause the processor to command the sensor to cease output of the sensor measurement signal.

11. The system of claim 5, wherein the data signal is operative to cause the processor to command the sensor change an interval between respective transmissions of the sensor measurement signal.

12. The system of claim 5, wherein the data signal is operative to cause the processor to change a power of the carrier signal.

13. The system of claim 5, wherein the data signal is operative to cause the processor to command the circuit to transmit the sensor measurement signal upon receipt of the data signal.

14. The system of claim 1, wherein the second switch is a first pair of diodes and the second switch is a second pair of diodes.

* * * * *